(12) United States Patent
Nishikawa et al.

(10) Patent No.: US 6,749,944 B2
(45) Date of Patent: Jun. 15, 2004

(54) STACKED FILM, METHOD FOR THE FORMATION OF STACKED FILM, INSULATING FILM, AND SUBSTRATE FOR SEMICONDUCTOR

(75) Inventors: Michinori Nishikawa, Mie (JP); Manabu Sekiguchi, Ibaraki (JP); Atsushi Shiota, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/252,606

(22) Filed: Sep. 24, 2002

(65) Prior Publication Data

US 2003/0059628 A1 Mar. 27, 2003

(30) Foreign Application Priority Data

Sep. 25, 2001 (JP) ......................................... 2001-291538

(51) Int. Cl.$^7$ ................................................. B32B 9/04
(52) U.S. Cl. ........................ 428/447; 428/212; 428/448; 427/407.1; 427/387
(58) Field of Search ................................. 428/447, 448, 428/212; 427/407.1, 387

(56) References Cited

FOREIGN PATENT DOCUMENTS

| EP | 0 851 480 | 7/1998 |
|---|---|---|
| EP | 1 127 929 | 8/2001 |
| EP | 1 146 092 | 10/2001 |
| EP | 1 160 848 | 12/2001 |
| WO | WO 00/75988 | 12/2000 |
| WO | WO 02/03442 | 1/2002 |
| WO | WO 02/083327 | 10/2002 |

*Primary Examiner*—David J. Buttner
*Assistant Examiner*—Christopher Keehan
(74) *Attorney, Agent, or Firm*—Oblon, Spivak, McClelland, Maier & Neustadt, P.C.

(57) ABSTRACT

A stacked film, a method for the production of the stacked film, an insulating film comprising the stacked film, and a substrate for semiconductor, using the insulating film. The stacked film comprises films of two or more kinds of alkoxysilane hydrolysis condensates having 5 nm or more difference in a mean radius of gyration, or films of alkoxysilane hydrolysis condensate having 0.3 or more difference in the dielectric constant. The stacked film is obtained by applying a coating solution comprising (B) a compound having a mean radius of gyration of less than 10 nm, and then applying a coating solution comprising (A) a compound having a mean radius of gyration of from 10 to 30 nm, followed by heating. The stacked film provides a dielectric film (substrate for semiconductor) having superior adhesion to a CVD film.

11 Claims, No Drawings

STACKED FILM, METHOD FOR THE FORMATION OF STACKED FILM, INSULATING FILM, AND SUBSTRATE FOR SEMICONDUCTOR

FILED OF THE INVENTION

The present invention relates to a stacked film, a method for the formation of a stacked film, an insulating film and a substrate for semiconductors. More particularly, it relates to a stacked film comprising films each having specific mean radius of gyration, a method for the formation of the stacked film, an insulating film obtained by the film formation method, having superior adhesion to a film formed by a CVD (Chemical Vapor Deposition) process as a dielectric film in, for example, semiconductor devices, and a substrate for semiconductors, comprising the insulating film.

DESCRIPTION OF THE RELATED ART

Hitherto, silica ($SiO_2$) films formed by a vacuum process such as a CVD process have been widely used as dielectric films in, for example, semiconductor devices. In recent years, insulating films of a coating type, comprising a hydrolyzate of a tetraalkoxysilane as a major component, which are called as SOG (Spin on Glass) films, have also been used for the purpose of forming more uniform dielectric films. In addition, as the degree of integration of, for example, semiconductor devices becomes large, dielectric films having a low dielectric constant, comprising, as a major component, a polyorganosiloxane called "organic SOG", have been developed.

Especially, for example, as the semiconductor devices become larger in degree of integration or more multiple in lamination, dielectric film materials having a lower dielectric constant, preferably a dielectric constant of 2.5 or less, and having superior adhesion to a substrate, have been being demanded.

As materials having a low dielectric constant, compositions comprising a mixture of fine particles obtained by condensation of an alkoxysilane in the presence of ammonia and a basic partial hydrolyzate of an alkoxysilane (see JP-A-5-263045 and JP-A-5-315319) and coating solutions obtained by condensation of a basic partial hydrolyzate of a polyalkoxysilane in the presence of ammonia (see JP-A-11-340219 and JP-A-11-340220) have been proposed. However, these materials involved problems such that when used singly, the adhesion to a substrate is inferior and that the dielectric constant exceeds 2.5.

SUMMARY OF THE INVENTION

The present invention has been made to overcome the above-described problems.

Accordingly, one object of the present invention is to provide a stacked film.

Another object of the present invention is to provide a method for the formation of the stacked film.

Still another object of the present invention is to provide an insulating film for semiconductor obtained by the film formation method, having superior adhesion to a film formed by a CVD process as a dielectric film in, for example, semiconductor devices.

Further object of the present invention is to provide a substrate for semiconductors, comprising the insulating film.

The stacked film according to one embodiment of the present invention comprises (A) a film prepared by heat curing (a) an alkoxysilane hydrolysis condensate having a mean radius of gyration of from 10 to 30 nm in the form of a solution, and (B) a film prepared by heat curing (b) an alkoxysilane hydrolysis condensate having a mean radius of gyration of less than 10 nm in the form of solution, with a difference in the mean radius of gyration between the alkoxysilane hydrolysis condensate (a) and the alkoxysilane hydrolysis condensate (b) being 5 nm or more.

The stacked film according to another embodiment of the present invention comprises (A) a film having a dielectric constant of 2.5 or less, which is prepared by heat curing (a) an alkoxysilane hydrolysis condensate in the form of a solution, and (B) a film having a dielectric constant exceeding 2.5, which is prepared by heat curing (b) an alkoxysilane hydrolysis condensate in the form of a solution, with a difference in the dielectric constant between the film (A) and the film (B) being 0.3 or more The method for the formation of a stacked film according to the present invention comprises applying a coating solution comprising (B) a compound having a mean radius of gyration of less than 10 nm, the compound being obtained by hydrolysis and condensation of an alkoxysilane compound, and an organic solvent on a substrate, followed by drying; and then applying a coating solution comprising (A) a compound having a mean radius of gyration of from 10 to 30 nm, the compound being obtained by hydrolysis and condensation of an alkoxysilane compound, and an organic solvent on the substrate, followed by heating.

The insulating film according to the present invention comprises the stacked film.

The substrate for semiconductor according to the present invention comprises the insulating film.

DETAILED DESCRIPTION OF THE INVENTION

The alkoxysilane hydrolysis condensate as referred to in the present invention is one obtained by hydrolysis and. condensation of at least one alkoxysilane comprising a compound represented by the following general formula (1) (hereinafter, referred to as "compound (1)"), a compound represented by the following general formula (2) (hereinafter, referred as "compound (2)"), and a compound represented by the following general formula (3) (hereinafter, referred to as "compound (3)"):

$$R_a Si(Or^1)_{4-a} \quad (1)$$

wherein R represents a hydrogen atom, a fluorine atom, or a monovalent organic group; $R^1$ represents a monovalent organic group; and a represents an integer of 1 or 2;

$$Si(OR^2)_4 \quad (2)$$

wherein $R^2$ represents a monovalent organic group; and $$R^3{}_b(R^4O)_{3-b}Si-(R^7)_d-Si(OR^5)_{3-c}R^6{}_c \quad (3)$$

wherein $R^3$ to $R^6$ may be the same or different and each represents a monovalent organic group; <u>b</u> and <u>c</u> may be the same or different and each represents a number of from 0 to 2; $R^7$ represents an oxygen atom, a phenylene group, or a group represented by $—(CH_2)_n—$, wherein n represents an integer of from 1 to 6; and d represents 0 or 1.

In the hydrolyzate as referred to in the present invention, it is not essential that all of the $R^1O—$ group, the $R^2O—$ group, the $R^4O—$ group, and the $R^5O—$ group contained in the compounds (1) to (3) are hydrolyzed. For example, the hydrolyzate may be one in which only one of the foregoing groups is hydrolyzed or one in which two or more of the foregoing groups are hydrolyzed, or a mixture thereof.

Further, in the condensate as referred to in the present invention, silanol groups in the hydrolyzates of the compound (1) to (3) are condensed to form Si—O—Si bonds. In the present invention, it is not essential that all of the silanol groups are condensed. The condensate includes one in which only a part of the silanol groups is condensed and a mixture of those having a different degree of condensation.

The alkoxysilane hydrolysis condensate is obtained by hydrolysis and condensation of at least one silane compound selected from the group consisting of the compounds (1) to (3) in the presence of a specific basic compound.

Compound (1):

In the foregoing general formula (1), examples of the monovalent organic group for R and $R^1$ include an alkyl group, an aryl group, an allyl group, and a glycidyl group. In the general formula (1), R is preferably a monovalent organic group, and especially an alkyl group or a phenyl group.

Examples of the alkyl group include a methyl group, an ethyl group, a propyl group, and a butyl group. The alkyl group preferably has from 1 to 5 carbon atoms and may be linear or branched. Further, the hydrogen atom(s) may be substituted with a fluorine atom.

In the general formula (1), examples of the aryl group include a phenyl group, a naphthyl group, a methylphenyl group, an ethylphenyl group, a chlorophenyl group, a bromophenyl group, and a fluorophenyl group.

Specific examples of the compound represented by the general formula (1) include trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, fluorotriphenoxysilane; methy ltrimethoxysilane, methyl triethoxysilane, methyl tri-n-propoxysilane, methyl triisopropoxysilane, methyl tri-n-butoxysilane, methyl tri-sec-butoxysilane, methyl tri-tert-butoxysilane, methyl triphenoxysilane, ethyl trimethoxysilane, ethyl triethoxysilane, ethyl tri-n-propxysilane, ethyl triisopropoxysilane, ethyl tri-n-butoxysilane, ethyl tri-sec-butoxysilane, ethyl tri-tert-butoxysilane, ethyl triphenoxysilane, vinyl trimethoxysilane, vinyl triethoxysilane, vinyl tri-n-propoxysilane, vinyl triisopropoxysilane, vinyl tri-n-butoxysilane, vinyl tri-sec-butoxysilane, vinyl tri-tert-butoxysilane, vinyl tripheoxysilane, n-propyl trimethoxysilane, n-propyl triethoxysilane, n-propyl tri-n-propoxysilane, n-propyl triisopropoxysilane, n-propyl tri-n-butoxysilane, n-propyl tri-sec-butoxysilane, n-propyl tri-tert-butoxysilane, n-propyl triphenoxysilane, isopropyl trimethoxysilane, isopropyl triethoxysilane, isopropyl tri-n-propoxysilane, isopropyl triisopropoxysilane, isopropyl tri-n-butoxysilane, isopropyl tri-sec-butoxysilane, isopropyltri-tert-butoxysilane, isopropyl triphenoxysilane, n-butyl trimethoxysilane, n-butyl triethoxysilane, n-butyl tri-n-propoxysilane, n-butyl triisopropoxysilane, n-butyl tri-n-butoxysilane, n-butyl tri-sec-butoxysilane, n-butyl tri-tert-butoxysilane, n-butyl triphenoxysilane, sec-butyl trimethoxysilane, sec-butyl triethoxysilane, sec-butyl tri-n-propoxysilane, sec-butyl triisopropoxysilane, sec-butyl tri-n-butoxysilane, sec-butyl tri-sec-butoxysilane, sec-butyl tri-tert-butoxysilane, sec-butyl triphenoxysilane, t-butyl trimethoxysilane, t-butyl triethoxysilane, t-butyl tri-n-propoxysilane, t-butyl triisopropoxysilane, t-butyl tri-n-butoxysilane, t-butyl tri-sec-butoxysilane, t-butyl tri-tert-butoxysilane, t-butyl triphenoxysilane, phenyl trimethoxysilane, phenyl triethoxysilane, phenyl tri-n-propoxysilane, phenyl triisopropoxysilane, phenyl tri-n-butoxysilane, phenyl tri-sec-butoxysilane, phenyl tri-tert-butoxysilane, phenyl triphenoxysilane, vinyl trimethoxysilane, vinyl triethoxysilane, γ-aminopropyl trimethoxysilane, γ-aminopropyl triethoxysilane, γ-glycidoxypropyl trimethoxysilane, γ-glycidoxypropyl triethoxysilane, γ-trifluoropropyl trimethoxysilane, γ-trilfuoropropyl triethoxysilane; dimethyl dimethoxysilane, dimethyl diethoxysilane, dimethyl di-n-propoxysilane, dimethyl diisopropxysilane, dimethyl di-n-butoxysilane, dimethyl di-sec-butoxysilane, dimethyl di-tert-butoxysilane, dimethyl dipheoxysilane, diethyl dimethoxysilane, diethyl diethoxysilane, diethyl di-n-propoxysilane, diethyl diisopropoxysilane, diethyl di-n-butoxysilane, diethyl di-sec-butoxysilane, diethyl di-tert-butoxysilane, diethyl diphenoxysilane, di-n-propyl dimethoxysilane, di-n-propyl diethoxysilane, di-n-propyl di-n-propoxysilane, di-n-propyl diisopropoxysilane, di-n-propyl di-n-butoxysilane, di-n-propyl di-sec-butoxysilane, di-n-propyl di-tert-butoxysilane, di-n-propyl diphenoxysilane, diisopropyl dimethoxysilane, diisopropyl diethoxysilane, diisopropyl di-propoxysilane, diisopropyl diisopropoxysilane, diisopropyl di-n-butoxysilane, diisopropyl di-sec-butoxysilane, diisopropyl di-tert-butoxysilane, diisopropyl diphenoxysilane, di-n-butyl dimethoxysilane, di-n-butyl diethoxysilane, di-n-butyl di-n-propoxysilane, di-n-butyl diisopropoxysilane, di-n-butyl di-n-butoxysilane, di-n-butyl di-sec-butoxysilane, di-n-butyl di-tert-butoxysilane, di-n-butyl diphenoxysilane, di-sec-butyl dimethoxysilane, di-sec-butyl diethoxysilane, di-sec-butyl di-n-propoxysilane, di-sec-butyl diisopropoxysilane, di-sec-butyldi-n-butoxysilane, di-sec-butyl di-sec-butoxysilane, di-sec-butyl di-tert-butoxysilane, di-sec-butyl diphenoxysilane, di-tert-butyl dimethoxysilane, di-tert-butyl diethoxysilane, di-tert-butyl di-n-propoxysilane, di-tert-butyl diisopropoxysilane, di-tert-butyl di-n-butoxysilane, di-tert-butyl di-sec-butoxysilane, di-tert-butyl di-tert-butoxysilane, di-tert-butyl diphenoxysilane, diphenyl dimethoxysilane, diphenyl diethoxysilane, diphenyl di-n-propoxysilane, diphenyl diisopropoxysilane, diphenyl di-n-butoxysilane, diphenyl di-dec-butoxysilane, diphenyl di-tert-butoxysilane, diphenyld iphenoxysilane, and divinyl trimethoxysilane.

Preferable examples of the compound (1) include methyl trimethoxysilane, methyl triethoxysilane, methyl tri-n-propoxysilane, methyl triisopropoxysilane, ethyl trimethoxysilane, ethyl triethoxysilane, vinyl trimethoxysilane, vinyl triethoxysilane, phenyl trimethoxysilane, phenyl triethoxysilane, dimethyl dimethoxysilane, dimethyl diethoxysilane, diethyl dimethoxysilane, diethyl diethoxysilane, diphenyl dimethoxysilane, and diphenyl diethoxysilane.

Those compounds may be used alone or as mixtures of two or more thereof.

Compound (2):

In the foregoing general formula (2), the monovalent organic group represented by $R^2$ can be the same organic groups as in the general formula (1).

Specific examples of the compound represented by the general formula (2) include tetramethoxysilane, tetraethoxysilane, tetra-n-propoxysilane, Aetraisopropoxysilane, tetra-n-butoxysilane, tetra-sec-butoxysilane, tetra-tert-butoxysilane, and tetraphenoxysilane.

Compound (3):

In the foregoing general formula (3), the monovalent organic group represented by $R^3$ to $R^6$ can be the same organic groups as in the general formula (1).

Examples of the compound represented by the general formula (3) wherein $R^7$ represents an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenylldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-tripheyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraetbyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane, Of these, preferable compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compound represented by the general formula (3) wherein d represents 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldis lane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Of these, preferable compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compound represented by the general formula (3) wherein $R^7$ represents $—(CH_2)_n—$ include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)-ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxysilyl)-2(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl) benzene, 1,4-bis(tri-n-propoxysilyl)benzene, 1,4-bis (triisopropoxysilyl)benzene, 1,4-bis(tri-n-butoxysilyl) benzene, 1,4-bis(tri-sec-butoxysilyl)benzene, and 1,4-bis (tri-tert-butoxysilyl)benzene.

Of these, preferable compounds are bis(trimethoxysilyl) methane, bis(triethoxysilyl)methane, 1,2-bis (trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis (dimethoxymethylsilyl)methane, bis(diethoxymethylsilyl) methane, 1,2-bis(dimethoxymethylsilyl)ethane, 1,2-bis (diethoxymethylsilyl)ethane, 1,2-bis(trimethoxysilyl) benzene, 1,2-bis(triethoxysilyl)benzene, 1,3-bis (trimethoxysilyl)benzene, 1,3-bis(triethoxysilyl)benzene, 1,4-bis(trimethoxysilyl)benzene, and 1,4-bis(triethoxysilyl) benzene.

In the present invention, as the compounds (1) to (3) constituting the alkoxysilane hydrolysis condensate, one or two or more kinds of the compounds (1), (2) and (3) can be used.

In the hydrolysis and condensation of at least one silane compound selected from the group consisting of the compounds (1) to (3) constituting the alkoxysilane hydrolysis condensate, it is preferred to use water in an amount of from 0.5 to 150 moles, and particularly preferably from 1 to 100 moles per mole of the alkoxysilane hydrolysis condensate. When the amount of water to be added is less than 0.5 moles, the resulting film may be inferior in crack resistance, whereas when it exceeds 150 moles, deposition or gelation of the polymer may possibly occur during the hydrolysis and condensation.

In the production of the alkoxysilane hydrolysis condensate according to the present invention, an alkaline catalyst, an acid catalyst, and a metal chelate compound are used during the hydrolysis and condensation of at least one silane compound selected from the group consisting of the compounds (1) to (3).

Examples of the alkaline catalyst include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine, and 3-amino-3-methylamine. Of these, amines or amine salts are preferable, organic amines or organic amine salts are more preferably, and alkylamines and tetraalkylammonium hydroxides are most preferably.

Those alkaline catalysts may be used alone or as mixtures of two or more thereof.

Examples of the metal chelate compound include titanium chelate compounds such as triethoxy.mono(acetylacetonato) titanium, tri-n-propoxy-mono(acetylacetonato)titanium, triisopropoxy.mono(acetylacetonato)titanium, tri-n-butoxy.mono(acetylacetonato)titanium, tri-sec-butoxy.mono (acetylacetonato)titanium, tri-tert-butoxy.mono (acetylacetonato)titanium, diethoxy.bis(acetylacetonato) titanium, di-n-propoxy.bis(acetylacetonato)titanium, diisopropoxy.bis(acetylacetonato)titanium, di-n-butoxy.bis (acetylacetonato)titanium, di-sec-butoxy.bis (acetylacetonato)titanium, di-tert-butoxy.bis (acetylacetonato)titanium, monoethoxy.tris (acetylacetonato)titanium, mono-n-propoxy.tris (acetylacetonato)titanium, monoisopropoxy.tris (acetylacetonato)titanium, mono-n-butoxy.tris (acetylacetonato)titanium, mono-sec-butoxy.tris (acetylacetonato)titanium, mono-tert-butoxy.tris (acetylacetonato)titanium, tetrakis(acetylacetonato) titanium, triethoxy.mono(ethyl acetoacetate)titanium, tri-n-propoxy.mono(ethyl acetoacetate)titanium, triisopropoxy.mono(ethyl acetoacetate)titanium, tri-n-butoxy.mono(ethyl acetoacetate)titanium, tri-sec-butoxy.mono(ethyl acetoacetate)titanium, tri-tert-butoxy.mono(ethyl acetoacetate)titanium, diethoxy.bis(ethyl acetoacetate)titanium, di-n-propoxy.bis(ethyl acetoacetate) titanium, diisopropoxy.bis(ethyl acetoacetate)titanium, di-n-butoxy.bis(ethyl acetoacetate)titanium, di-sec-butoxy.bis (ethyl acetoacetate)titanium, di-tert-butoxy.bis(ethyl acetoacetate)titanium, monoethoxy.tris(ethyl acetoacetate) titanium, mono-n-propoxy.tris(ethyl acetoacetate)titanium, monoisopropoxy.tris(ethyl acetoacetate)titanium, mono-n-butoxy.tris(ethyl acetoacetate)titanium, mono-sec-butoxy.tris(ethyl acetoacetate)titanium, mono-tert-butoxy.tris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium, and tris(acetylacetonato)mono(ethyl acetoacetate)titanium; zirconium chelate compounds such as triethoxy.mono(acetylacetonato)zirconium, tri-n-propoxy.mono(acetylacetonato)zirconium, triisopropoxy.mono(acetylacetonato)zirconium, tri-n-butoxy.mono(acetylacetonato)zirconium, tri-sec-butoxy.mono(acetylacetonato)zirconium, tri-tert-butoxy-mono(acetylacetonato)zirconium, diethoxy.bis (acetylacetonato)zirconium, di-n-propoxy.bis (acetylacetonato)zirconium, diisopropoxy.bis (acetylacetonato)zirconium, di-n-butoxy.bis (acetylacetonato)zirconium, di-sec-butoxy.bis (acetylacetonato)zirconium, di-tert-butoxy.bis (acetylacetonato)zirconium, monoethoxy.tris (acetylacetonato)zirconium, mono-n-propoxy.tris (acetylacetonato)zirconium, monoisopropoxy.tris (acetylacetonato)zirconium, mono-n-butoxy.tris (acetylacetonato)zirconium, mono-sec-butoxy.tris (acetylacetonato)zirconium, mono-tert-butoxy.tris (acetylacetonato)zirconium, tetrakis(acetylacetonato) zirconium, triethoxy.mono(ethyl acetoacetate)zirconium, tri-n-propoxy.mono(ethyl acetoacetate)zirconium, triisopropoxy.mono(ethyl acetoacetate)zirconium, tri-n-butoxy.mono(ethyl acetoacetate)zirconium, tri-sec-butoxy.mono(ethyl acetoacetate)zirconium, tri-tert-butoxy.mono(ethyl acetoacetate)zirconium, diethoxy.bis (ethyl acetoacetate)zirconium, di-n-propoxy.bis(ethyl acetoacetate)zirconium, diisopropoxy.bis(ethyl acetoacetate)zirconium, di-n-butoxy.bis(ethyl acetoacetate) zirconium, di-sec-butoxy.bis(ethyl acetoacetate)zirconium, di-tert-butoxy.bis(ethyl acetoacetate)zirconium, monoethoxy.tris(ethyl acetoacetate)zirconium, mono-n-propoxy.tris(ethyl acetoacetate)zirconium, monoisopropoxy.tris(ethyl acetoacetate)zirconium, mono-n-butoxy.tris(ethyl acetoacetate)zirconium, mono-sec-butoxy.tris(ethyl acetoacetate)zirconium, mono-tertbutoxy.tris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium, and tris(acetylacetonato)mono (ethyl acetoacetate)zirconium; and aluminum chelate compounds such as tris(acetylacetonato)aluminum and tris(ethyl acetoacetate)aluminum. Of these are preferable titanium or aluminum chelate compounds, and particularly preferably titanium chelate compounds.

Those metal chelate compounds may be used alone or as mixtures of two or more thereof.

Examples of the acid catalyst include inorganic acids such as hydrochloric acid, nitric acid, sulfuric acid, hydrofluoric acid, phosphoric acid, boric acid, and hydrobromic acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidic acid, shikimic acid, 2-ethylhexanoic acid, oleic acid, stearic acid, linolic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, a hydrolyzate of glutaric acid, a hydrolyzate of maleic anhydride, and a hydrolyzate of phthalic anhydride. Of these, organic carboxylic acids are preferable.

Those acid catalysts may be used singly or in admixture of two or more thereof.

An amount of the catalyst to be used is usually from 0.00001 to 10 moles, and preferably from 0.00005 to 5 moles, per mole of the sum of the groups represented by the $R^1O-$ group, the $R^2O-$ group, the $R^4O-$ group, and the $R^5O-$ group contained in the compounds (1) to (3). When the amount of the catalyst to be used falls within the above-described range, there is a little of occurrence of deposition or gelation of the polymer during the reaction. Further, in the present invention, a temperature at which the compounds (1) to (3) are hydrolyzed is usually from 0 to 100° C., and preferably from 15 to 80° C.

When the compounds (1) to (3) are converted in terms of the complete hydrolysis condensate, an amount of the compound (2) is from 5 to 75% by weight, preferably from 10 to 70% by weight, and more preferably from 15 to 70% by weight, based on the weight of the sum of the compounds (1) to (3). Further, an amount of the compound (1) and/or the compound (3) is from 95 to 25% by weight, preferably from 90 to 30% by weight, and more preferably from 85 to 30% by weight, based on the weight of the sum of the compounds (1) to (3). When the amount of the compound (2) is from 5 to 75% by weight based on the weight of the sum of the compounds (1) to (3), the resulting film is high in modulus of elasticity and is particularly superior in low dielectric properties.

The complete hydrolysis condensate as referred to herein means that the $R^1O-$ group, the $R^2O-$ group, the $R^4O-$ group, and the $R^5O-$ group in the compounds (1) to (3) are complete (i.e., at 100%) hydrolyzed and converted into an SiOH group, followed by complete condensation to form a siloxane structure.

In addition, the alkoxysilane hydrolysis condensate is preferably a hydrolysis condensate of the compound (1) and the compound (2). This is because the resulting composition is more superior in storage stability.

In the present invention, a stacked film can be formed by a method which comprises forming (B) a film comprising an alkoxysilane hydrolysis condensate having a mean radius of gyration of less than 10 nm (this film being referred to as "coating film B") on a substrate and then forming (A) a film comprising an alkoxysilane hydrolysis condensate having a mean radius of gyration of from 10 to 30 nm (this film being referred to as "coating film A"), followed by heating (method 1); or a method which comprises forming (B) a film having a dielectric constant exceeding 2.5, which is prepared by heating and hardening an alkoxysilane hydrolysis condensate (this film being referred to as "hardened film B"), on a substrate and then forming (A) a film having a dielectric constant of 2.5 or less, which is prepared by heating and hardening an alkoxysilane hydrolysis condensate (this film being referred to as "hardened film A") (method 2).

In the present invention, a film forming composition having a total solids content of from 1 to 30% by weight, which is prepared by usually dissolving or dispersing the alkoxysilane hydrolysis condensate in an organic solvent and optionally adding other additives thereto is first applied on a substrate and then dried to form the coating film B. Next, the coating film A is formed in the same manner.

As the organic solvent, at least one member selected from the group consisting of alcoholic solvents, ketone-based solvents, amide-based solvents, ester-based solvents, and aprotic solvents can be used.

Examples of the alcoholic solvents include monohydric alcohols such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; and polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcoholic solvents may be used alone or as mixtures of two or more thereof.

Examples of the ketone-based solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohaxanone, 2-hexanone, methylcyclohexanone, 2,4-pentanedione, acetonylacetone, acetophenone, and fenchone, and further include β-diketones such as acetylacetone, 2,4-hexanedione, 2,4-heptanedione, 3,5- heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone-based solvents may be used alone or as mixtures of two or more thereof.

Examples of the amide-based solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide-based solvents may be used alone or as mixtures of two or more thereof.

Examples of the ester-based solvents include diethyl carbonate, ethylene carbonate, propylene carbonate, diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, acetic acid ethylene glycol monomethyl ether, acetic acid ethylene glycol monoethyl ether, acetic acid diethylene glycol monomethyl ether, acetic acid diethylene glycol monoethyl ether, acetic acid diethylene glycol mono-n-butyl ether, acetic acid propylene glycol monomethyl ether, acetic acid propylene glycol monoethyl ether, acetic acid propylene glycol monopropyl ether, acetic acid propylene glycol monobutyl ether, acetic acid dipropylene glycol monomethyl ether, acetic acid dipropylene glycol monoethyl ether, diacetic acid glycol, methoxyacetatic acid triglycol, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester-based solvents may be used alone or as mixtures of two or more thereof.

Examples of the aprotic solvents include acetonitrile, dimethyl sulfoxide, N,N,N',N'-tetraethylsulfamide, hexamethylphosphoric triamide, N-methylmorpholine, N-methylpyrrole, N-ethylpyrrole, N-methyl-Δ3-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

Of those organic solvents, organic solvents represented by the following general formula (4) are particularly preferably used:

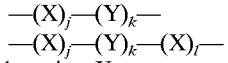         (4)

wherein $R^8$ and $R^9$ independently represent a hydrogen atom or a monovalent organic group selected from an alkyl group having from 1 to 4 carbon atoms and $CH_3CO$—; and e represents an integer of 1 or 2.

Those organic solvents may be used alone or as mixtures of two or more thereof.

In the film forming composition that is used in the present invention, the same solvent can be used during the hydrolysis and/or condensation of the compounds (1) to (3) constituting the alkoxysilane hydrolysis condensate.

Specifically, water or a solvent-diluted water is added intermittently or continuously to the solvent in which the compounds (1) to (3) are dissolved. During this time, the specific basic compound may be added previously in the solvent, or may be dissolved or dispersed in water during the hydrolysis. A reaction temperature is usually from 0 to 100° C., and preferably from 15 to 90° C.

Other Additives:

The film forming composition that is used in the present invention may further contain components such as colloidal silica, organic polymers, surfactants, silane coupling agents, and radical initiators.

The colloidal silica as referred to herein means a dispersion of, for example, high-purity silicic anhydride dispersed in the above-described hydrophilic organic solvent, which usually has a mean particle size of from 5 to 30 nm, and preferably from 10 to 20 nm and a solids content of from about 10 to 40% by weight. Examples of the colloidal silica include Methanol Silica Sol and Isopropanol Silica Sol, both of which are available from Nissan Chemical Industries, Ltd., and Oscar available from Catalysts & Chemicals Ind. Co., Ltd.

Examples of the organic polymers include compounds having an oligosaccharide, vinylamide-based polymers, (meth)acrylic polymers, aromatic vinyl compounds, dendrimer, polyimides, polyamic acid, polyarylenes, polyamides, polyquinoxalines, polyoxadiazoles, fluorocarbon polymers, and compounds having a polyalkylene oxide structure.

Examples of the compounds having a polyalkylene oxide structure are those having a polymethylene oxide strcture, a polyethylene oxide structure, a polypropylene oxide structure, a polytetramethylene oxide structure, or a polybutylene oxide structure.

Specific examples include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of an alkylphenol-formaldehyde condensate, polyoxyethylene-polyoxypropylene block copolymers, and polyoxyethylene-polyoxypropylene alkyl ethers; ether ester type compounds such as polyoxyethylene glycerin fatty acid esters, polyoxyethylene sorbitan fatty acid esters, polyoxyethylene sorbitol fatty acid esters, and polyoxyethylene fatty acid alkanolamide sulfates; and ether ester type compounds such as polyethylene glycol fatty acid esters, ethylene glycol fatty acid esters, fatty acid monoglycerides, polyglycerin fatty acid esters, sorbitan fatty acid esters, propylene glycol fatty acid esters, and sucrose fatty acid esters.

Examples of the polyoxyethylene-polyoxypropylene block copolymers include compounds having the following block structures:

wherein X represents a group represented by —$CH_2CH_2O$—; Y represents a group represented by —$CH_2CH(CH_3)O$—; j represents a number of from 1 to 90; k represents a number of from 10 to 99; and l represents a number of from 0 to 90.

Of those, preferable ether type compounds are polyoxyethylene alkyl ethers, polyoxyethylene-polyoxypropylene block copolymers, polyoxyethylene-polyoxypropylene alkyl ethers, polyoxyethylene glycerin fatty acid esters, polyoxyethylene sorbitan fatty acid esters, and polyoxyethylene sorbitol fatty acid esters.

Those compounds may be used alone or as mixtures of two or more thereof.

Examples of the surfactant include nonionic surfactants, anionic surfactants, cationic surfactants, and ampholytic surfactants. Further, fluorocarbon-based surfactants, silicone-based surfactants, polyalkylene oxide-based-surfactants, and poly(meth)acrylate-based surfactants can be exemplified. Of those, fluorocarbon-based surfactants and silicone-based surfactants are preferable.

Examples of the fluorocarbon-based surfactants that can be used include fluorocarbon-based surfactants comprising a compound having a fluoroalkyl group or a fluoroalkylene group in at least one site of the terminals, the main chain, and the side chains, such as 1,1,2,2-tetrafluorooctyl (1,1,2,2-tetrafluoropropyl) ether, 1,1,2,2-tetrafluorooctyl hexyl ether, octaethylene glycol di(1,1,2,2-tetrafluorobutyl) ether, hexaethylene glycol (1,1,2,2,3,3-hexafluoropentyl) ether, octapropylene glycol di(1,1,2,2-tetrafluorobutyl) ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-[3-(perfluorooctanesulfonamido)propyl]-N,N'-dimethyl-N-carboxymethyleneammonium betain, perfluoroalkylsulfonamidopropyltrimethylammonium salts, perfluoroalkyl-N-ethylsulfonyl glycine salts, bis(N-perfluorooctylsulfonyl-N-ethylaminoethyl) phosphate, and monoperfluoroalkylethyl phosphates.

Examples of commercially available fluorocarbon-based surfactants include Megafac F142D, Megafac F172, Megafac F173, and Megafac F183 (all being available from Dainippon Ink and Chemicals, Incorporated); Eftop EF301, Eftop EF303, and Eftop EF352 (all being available from Shin Akita Kasei K.K.); Fluorad FC-430 and Fluorad FC-431 (all being available from Sumitomo 3M Limited); Asahi Guard AG710, Surflon S-382, Surflon SC-101, Surflon SC-102, Surflon SC-103, Surflon SC-104, Surflon SC-105, and Surflon SC-106 (all being available from Asahi Glass Company); BM-1000 and BM-1100 (all being available from Yusho K.K.); and NBX-15 (available from Neos K.K.). Of these, Megafac F172, BM-1000, BM-1100, and NBX-15 are particularly preferable.

Examples of the silicone-based surfactants that can be used include SH7PA, SH21PA, SH30PA, and ST94PA (all being available from Toray Dow Corning Silicone Co., Ltd.). Of these, SH28PA and SH30PA are particularly preferable.

An amount of the surfactant to be used is usually from 0.0001 to 10 parts by weight per 100 parts by weight of the alkoxysilane hydrolysis condensate (complete hydrolysis condensate).

Those surfactants may be used alone or as mixtures of two or more thereof.

Examples of the silane coupling agents include 3-glycidoxypropyl trimethoxysilane, 3-aminoglycidoxypropyl triethoxysilane, 3-methacryloxypropyl trimethoxysilane, 3-glycidoxypropylmethyl dimethoxysilane, 1-methacryloxypropylmethyl dimethoxysilane, 3-aminopropyl trimethoxysilane, 3-aminopropyl triethoxysilane, 2-aminopropyl trimethoxysilane, 2-aminopropyl triethoxysilane, N-(2-aminoethyl)-3-aminopropyl trimethoxysilane, N-(2-aminoethyl)-3-aminopropylmethyl dimethoxysilane, 3-ureidopropyl trimethoxysilane, 3-ureidopropyl triethoxysilane, N-ethoxycarbonyl-3-aminopropyl trimethoxysilane, Nethoxycarbonyl-3-aminopropyl triethoxysilane, N-triethoxysilylpropyl triethylenetriamine, N-triethoxysilylpropyl triethylenetriamine, 10-trimethoxysilyl-1,4,7-triazadecane, 10-triethoxysilyl-1,4,7-triazadecane, 9-trimetboxysilyl-3,6-diazanonyl acetate, 9-triethoxysilyl-3,6-diazanonyl acetate, N-benzyl-3-aminopropyl trimethoxysilane, N-benzyl-3-aminopropyl triethoxysilane, N-phenyl-3-aminopropyl trimethoxysilane, N-phenyl-3-aminopropyl triethoxysilane, N-bis (oxyethylene)-3-aminopropyl trimethoxysilane, and N-bis (oxyethylene)-3-aminopropyl triethoxysilane.

Those silane coupling agents may be used alone or as mixtures of two or more thereof.

Examples of the radical initiators include isobutyryl peroxide, α,α'-bis(neodecanoyl peroxy)diisopropylbenzene, cumyl peroxyneodecanoate, di-n-propyl peroxydicarboxnate, diisopropyl, peroxydicarbonate, 1,1,3,3-tetramethylbutyl peroxyneodecanoate, bis(4-tert-butylcyclohexyl) peroxydicarbonate, 1-cyclohexyl-1-methylethyl peroxyneodecanoate, di-2-ethoxyethyl peroxydicarbonate, di(2-ethylhexyl peroxy)dicarbonate, tert-hexyl peroxyneodicarbonate, dimethoxybutyl peroxydicarbonate, di(3-methyl-3-mehoxybutyl peroxy) dicarbonate, tert-butyl peroxyneodecanoate, 2,4-dichlorobenzoyl peroxide, tert-hexyl peroxypivalate, tert-butyl peroxypivalate, 3,5,5-trimetbylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoyl peroxy) hexane, 1-cyclohexyl-1-methylethyl peroxy-2-ethylhexanoate, tert-hexyl peroxy-2-ethylhexanoate, tert-butyl peroxy-2-ethylhexanoate, m-toluoylandbenzoyl peroxide, benzoyl peroxide, tert-btuyl peroxyisobutyrate, di-tert-butyl peroxy-2-methylcyclohexane, 1,1-bis(tert-hexyl peroxy)-3,3,5-trimethylcyclohexane, 1,1-bis(tert-hexyl peroxy)cycloxane, 1,1-bis(tert-butyl peroxy)-3,3,5-trimethylcyclohexane, 1,1-bis(tert-butyl peroxy) cyclohexane, 2,2,-bis(4,4-di-tert-butyl peroxycyclohexyl) propane, 1,1-bis(tert-butyl peroxy)cyclodecane, tert-hexyl peroxyisopropyl monocarbonate, tert-butyl peroxymaleic acid, tert-butyl peroxy-3,3,5-trimethylhexanoate, tert-butyl peroxylaurate, 2,5-dimethyl-2,5-di(m-toluoyl peroxy) hexane, tert-butyl peroxyisopropyl monocarbonate, tert-butyl peroxy-2-ethylhexyl monocarbonate, tert-hexyl peroxybenzoate, 2,5-dimethyl-2,5-di(benzoyl peroxy) hexane, tert-butyl peroxyacetate, 2,2-bis(tert-butyl peroxy) butane, tert-butyl peroxybenzoate, n-butyl-4,4-bis(tert-butyl peroxy) valerate, di-tert-butyl peroxyisophthalate, α,α'-bis (tert-butyl peroxy)diisopropylbenzene, dicumyl peroxide, 2,5-dimethyl-2,5-di(tert-butyl peroxy)hexane, tert-butylcumyl peroxide, di-tert-butyl peroxide, p-menthane hydroperoxide, 2,5-dimethyl-2,5-di(tert-butyl peroxy) hexyne-3, diisopropylbenzene hydroperoxide, tert-butyltrimethylsilyl peroxide, 1,1,3,3-tetramethylbutyl hydroperoxide, cumene hydroperoxide, tert-hexyl hydroperoxide, tert-btuyl hydroperoxide, and 2,3-dimethyl-2,3-diphenylbutane.

An amount of the radical initiator to be compounded is preferably from 0.1 to 10 parts by weight per 100 parts by weight of the polymer.

Those radical initiators may be used alone or as mixtures of two or more thereof.

In the present invention, it is preferred that the catalyst that is used for the synthesis of the alkoxysilane hydrolysis condensate having a mean radius of gyration of from 10 to 30 nm in the method 1, or of the alkoxysilane hydrolysis condensate for obtaining the film having a dielectric constant of 2.5 or less in the method 2, is an alkaline catalyst.

During laminating the films, it is preferred that the film to be brought into contact with a CVD film is the coating film B in the method 1 and the hardened film B in the method 2, respectively from the viewpoint of adhesion between the CVD film and the film.

Further, it is preferred that the coating film B has a film thickness of from ½ to 1/20 of that of the coating film A in the method 1 and that the hardened film B has a film thickness of from ½ to 1/20 of that of the hardened film A in the method 2.

In the method 1, when the film thickness of the coating film B exceeds ½ of that of the coating film A, an effective dielectric constant of an insulating film becomes large, whereas when it is less than 1/20, an improving effect of the adhesion to the CVD film becomes small.

In the present invention, the CVD film is a film containing Si and further containing at least one element selected from the group consisting of O, C, N, and H. Examples of such a film are films prepared by using a compound selected from, for example, tetramethoxysilane, tetraethoxysilane, methyl trimethoxysilane, methyl triethoxysilane, dimethyl dimethoxysilane, dimethyl diethoxysilane, silane, tetramethylsilane, trimethylsilane, dimethylsilane, methylsilane, ethylsilane, phenylsilane, diphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,1,3,3-tetramethyldisiloxane, trimethylsiloxane, 1,3-bis(silanomethyl)disiloxane, bis(1-methyldisiloxanyl)methane, 2,2-bis(1-methyldisiloxanyl)propane, 2,4,6,8-tetramethylcyclotetrasiloxane, octamethylcyclotetrasiloxane, 2,4,6-trisilanetetrahydropyran, 2,5-disilanetetrahydrofuran, and derivatives thereof and subjecting the compound to plasma polymerization in the presence of, for example, oxygen, carbon monoxide, carbon dioxide, nitrogen, argon, ammonia, or $N_2O$.

In applying the film forming composition on a substrate, coating means such as spin coating, dip coating, role coating, and spray coating is employed.

The film can be formed in a film thickness (on a dry basis) of from about 0.02 to 2.5 μm in single coating and of from about 0.04 to 5.0 μm in double coating. Thereafter, the film is dried at ambient temperature, or dried usually under heating at a temperature of from about 80 to 600° C. for from about 5 to 240 minutes. Thus, a glassy or macromolecular insulating film can be formed.

Examples of the heating means that can be used include a hot plate, an oven, and a furnace. The heating may be carried out in an atmospheric environment, a nitrogen atmosphere, or an argon atmosphere, in vacuo, or under a reduced pressure at which an oxygen concentration is controlled.

Further, the film may be formed upon irradiation with electron beams or ultraviolet light rays.

In order to regulate the hardening rate of the film, if desired, the film may be heated stepwise, or an atmosphere of nitrogen, air or oxygen or an atmosphere under reduced pressure may be used.

The thus obtained dielectric film is superior in adhesion to the CVD film. Accordingly, it is useful for applications such as dielectric films for semiconductor devices including LSI, system_LSI, DRAM, SDRAM, RDRAM, and D-RDRAM, etching stopper films, protective films such as surface coating films of semiconductor devices, interlayers in the preparation step of semiconductors using multilayered resists, dielectric films of multilayered wiring boards, protective films or insulating films for liquid crystal display devices, and protective films or insulating films for electroluminescence display devices.

The present invention will be described more specifically with reference to the following Examples. However, the following description will generalize embodiments of the present invention, and it should not be construed that the invention is limited thereto without particular reasons.

In the Examples and Comparative Examples, all parts and percentages are on a weight basis unless otherwise indicated.

Various evaluations were made in the following manners.
Radius of Gyration:

The radius of gyration was measured by the gel permeation chromatography (GPC) (measurement of refractive index, viscosity and light scattering) under the following condition.

Sample solution: An alkoxysilane hydrolysis condensate was diluted with methanol containing 10 mM LiBr such that the solids content was 0.25%, to prepare a sample solution for GPC (measurement of refractive index, viscosity and light scattering).

Instrument:

GPC system, Model GPC-8020, available from Tosoh Corporation

Column, Alpha 5000/3000, available from Tosoh Corporation

Viscosity detector and light scattering detector, available from Viscotech Co., Ltd.

Model T-60 Dual Meter

Carrier solution: Methanol containing 10 mM LiBr

Feeding rate of carrier solution: 1 ml/min

Column temperature: 40° C.

Dielectric Constant of Film:

A composition sample was applied on an 8-inch silicone wafer by spin coating, and the substrate was dried at 80° C. for one minutes on a hot plate and then at 200° C. for one minutes in a nitrogen atmosphere. The substrate was further cured on the hot plate in a nitrogen atmosphere at 400° C. for 18 minutes. An aluminum electrode pattern was formed on the thus obtained film by vapor deposition, to prepare a sample for measurement of dielectric constant. The sample was subjected to measurement of dielectric constant of the film at a frequency of 100 kHz by the CV process using HP16451B Electrodes and HP4284A Precision LCR Meter (all being available from Yokogawa-Hewlett-Packard, Ltd.).
Adhesion of Stacked Film:

The adhesion of the stacked film was carried out in the following manner. Ten stud pins was fixed on the uppermost layer of the substrate using an epoxy resin, followed by drying at 150° C. for one hour. The stud pins were then subjected to a drawing test by the Sebastian's process, and the adhesion was evaluated according to the following criteria.

Good adhesion: No peeling occurred in an interface between the CVD film and the film with respect to all of the ten stud pins.

Poor adhesion: Peeling occurred in an interface between the CVD film and the film.

SYNTHESIS EXAMPLE 1

A quartz-made separable flask were charged with 570 g of distilled ethanol, 160 g of ion-exchanged water, and 30 g of a 10% aqueous tetramethylammonium hydroxide solution, and the resulting mixture was uniformly stirred. A mixture of 136 g of methyl trimethoxysilane and 209 g of tetraethoxysilane was added to the solution, and. the resulting solution was reacted for 5 hours while keeping at 60° C. 300 g of propylene glycol monopropyl ether was added to the reaction mixture, and the mixture was concentrated using an evaporator at 50° C. until the concentration became 10% (converted as the complete hydrolysis condensation).

Thereafter, 10 g of a 10% solution of acetic acid in propylene glycol monopropyl ether was added to the concentrated solution, to obtain a reaction solution (1).

The thus obtained condensate had a radius of gyration of 17.8 nm and a dielectric constant of 2.23.

SYNTHESIS EXAMPLE 2

A quartz-made separable flask were charged with 570 g of distilled ethanol, 160 g of ion-exchanged water, and 100 g of a 10% aqueous tetramethylammonium hydroxide solution, and the resulting mixture was uniformly stirred. A mixture of 136 g of methyl trimethoxysilane and 209 g of tetraethoxysilane was added to the solution, and the resulting solution was reacted for 5 hours while keeping at 60° C. 300 g of propylene glycol monopropyl ether was added to the reaction mixture, and the mixture was concentrated using an evaporator at 50° C. until the concentration became 10% (converted as the complete hydrolysis condensation). Thereafter, 10 g of a 10% solution of acetic acid in propylene glycol monopropyl ether was added to the concentrated solution, to obtain a reaction solution (2).

The thus obtained condensate had a radius of gyration of 5.7 nm and a dielectric constant of 2.67.

SYNTHESIS EXAMPLE 3

A quartz-made separable flask were dissolved with 154.24 g of methyl trimethoxysilane, 288.83 g of tetramethoxysilane, and 250 g of distilled propylene glycol monoethyl ether. 297 g of ion-exchanged water having 10 g of maleic acid dissolved therein was added dropwise to the solution over one hour. The mixture was reacted at 50° C. for 3 hours, to obtain a reaction solution (3).

The thus obtained condensate had a radius of gyration of 0.2 nm and a dielectric constant of 2.88.

SYNTHESIS EXAMPLE 4

In a quartz-made separable flask, 276.01 g of methyl trimethoxysilane, 86.14 g of tetramethoxysilane, and 0.0092 g of tetrakis(acetylacetonato)titanium were dissolved in 101 g of propylene glycol monoethyl ether, and the resulting mixture was stirred using a three-one motor, thereby stabilizing the solution temperature at 55° C. Next, a mixed solution of 225.52 g of ion-exchanged water and 263.00 g of propylene glycol monoethyl ether was added thereto over one hour. Thereafter, the mixture was reacted at 55° C. for 4 hours. Then, 48.12 g of acetylacetone was added to the reaction mixture, and the mixture was reacted for an additional 30 minutes, followed by cooling to room temperature. 227 g of the solution containing methanol and water was removed from the reaction mixture at 50° C. using an evaporator, to obtain a reaction solution (4).

The thus obtained condensate had a radius of gyration of 0.3 nm and a dielectric constant of 2.85.

SYNTHESIS EXAMPLE 5

A quartz-made separable flask were charged with 570 g of distilled ethanol, 160 g of ion-exchanged water, and 30 g of a 10% aqueous tetramethylammonium hydroxide solution, and the resulting mixture was uniformly stirred. A mixture of 136 g of methyl trimethoxysilane and 209 g of tetraethoxysilane was added to the solution, and the resulting solution was reacted for 4 hours while keeping at 58° C. 300 g of propylene glycol monopropyl ether was added to the reaction mixture, and the mixture was concentrated using an evaporator at 50° C. until the concentration became 10% (converted as the complete hydrolysis condensation). Thereafter, 10 g of a 10% solution of acetic acid in propylene glycol monopropyl ether was added to the concentrated solution, to obtain a reaction solution (5).

The thus obtained condensate had a radius of gyration of 15.8 nm and a dielectric constant of 2.32.

EXAMPLE 1

A CVD film made of tetraethoxysilane having a film thickness of 1,000 angstroms was formed on an 8-inch silicone wafer using Producer S available from Applied Material. This film had an elemental composition of Si (32 atomic %), O (64 atomic %) and H (4 atomic %).

The reaction solution (2) was applied in a film thickness of 500 angstroms on this film, and the substrate was dried at 80° C. for one minute and then at 200° C. for one minute. Further, the reaction solution (1) was applied in a film thickness of 5,000 angstroms on this substrate, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, no peeling in an interface between the CVD film and the film was observed.

EXAMPLE 2

A CVD film made of tetramethylsilane having a film thickness of 1,000 angstroms was formed on an 8-inch silicone wafer using Producer S available from Applied Material. This film had an elemental composition of Si (26 atomic %), O (3 atomic %), C (26 atomic %) and H (45 atomic %).

The reaction solution (3) was applied in a film thickness of 500 angstroms on this film, and the substrate was dried at 80° C. for one minute and then at 200° C. for one minute. Further, the reaction solution (1) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, no peeling in an interface between the CVD film and the film was observed.

EXAMPLE 3

A CVD film made of trimethylsilane having a film thickness of 1,000 angstroms was formed on an 8-inch silicone wafer using Sequel Express available from Nevellus. This film had an elemental composition of Si (25 atomic %), O (4 atomic %), C (21 atomic %), N (14 atomic %) and H (36 atomic %).

The reaction solution (4) was applied in a film thickness of 500 angstroms on this film, and the substrate was dried at 80° C. for one minute and then at 200° C. for one minute. Further, the reaction solution (1) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, no peeling in an interface between the CVD film and the film was observed.

EXAMPLE 4

A CVD film made of silane and ammonia having a film thickness of 1,000 angstroms was formed on an 8-inch silicone wafer using Sequel Express available from Nevellus. This film had an elemental composition of Si (49 atomic %), O (4 atomic %), C (3 atomic %), N (40 atomic %) and H (4 atomic %).

The reaction solution (2) was applied in a film thickness of 500 angstroms on this film, and the substrate was dried at 80° C. for one minute and then at 200° C. for one minute. Further, the reaction solution (1) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, no peeling in an interface between the CVD film and the film was observed.

EXAMPLE 5

On the substrate obtained in Example 2, the reaction solution (3) was applied in a film thickness of 500 angstroms, and the substrate was dried at 80° C. for one minute and then at 200° C. for one minute. The resulting substrate was cured on a hot plate in a nitrogen atmosphere at 400° C. for 18 minutes. CVD film made of tetraethoxysilane having a film thickness of 1,000 angstroms was formed on this substrate using Producer S available from Applied Material. This film had an elemental composition of Si (32 atomic %), O (64 atomic %) and H (4 atomic %).

The adhesion of the stacked film was evaluated. As a result, no peeling in an interface between the CVD film and the film was observed.

EXAMPLE 6

On the substrate obtained in Example 3, the reaction solution (4) was applied in a film thickness of 500 angstroms, and the substrate was dried at 80° C. for one minute and then at 200° C. for one minute. The resulting substrate was cured on a hot plate in a nitrogen atmosphere at 400° C. for 18 minutes. On this substrate, a CVD film made of trimethylsilane having a film thickness of 1,000 angstroms was formed using Sequel Express available from Nevellus. This film had an elemental composition of Si (25 atomic %), O (4 atomic %), C (21 atomic %), N (14 atomic %) and H (36 atomic %).

The adhesion of the stacked film was evaluated. As a result, no peeling in an interface between the CVD film and the film was observed.

COMPARATIVE EXAMPLE 1

A CVD film made of tetraethoxysilane having a film thickness of 1,000 angstroms was formed on an 8-inch silicone wafer using Producer S available from Applied Material. This film had an elemental composition of Si (32 atomic %), O (64 atomic %) and H (4 atomic %).

The reaction solution (1) was applied in a film thickness of 5,000 angstroms on this film, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, peeling was observed in an interface between the CVD film and the film with respect to the seven stud pins.

COMPARATIVE EXAMPLE 2

A CVD film made of tetraethoxysilane having a film thickness of 1,000 angstroms was formed on an 8-inch silicone wafer using Producer S available from Applied Material. This film had an elemental composition of Si (32 atomic %), O (64 atomic %) and H (4 atomic %).

The reaction solution (5) was applied in a film thickness of 500 angstroms on this film, and the substrate was dried at 80° C. for one minute and then at 200° C. for one minute. Further, the reaction solution (1) was applied in a film thickness of 5,000 angstroms on this substrate, and the substrate was dried at 80° C. for one minute and then at 200° C. for one minute. The resulting substrate was cured on a hot plate in a nitrogen atmosphere at 400° C. for 18 minutes.

The adhesion of the stacked film was evaluated. As a result, peeling was observed in an interface between the CVD film and the film with respect to the five stud pins.

COMPARATIVE EXAMPLE 3

A CVD film made of tetraethoxysilane having a film thickness of 1,000 angstroms was formed on an 8-inch silicone wafer using Producer S available from Applied Material. This film had an elemental composition of Si (32 atomic %), O (64 atomic %) and H (4 atomic %).

The reaction solution (1) was applied in a film thickness of 5,000 angstroms on this film, and the substrate was dried at 80° C. for one minute and then at 200° C. for one minute. The resulting substrate was cured on a hot plate in a nitrogen atmosphere at 400° C. for 18 minutes. On this substrate, a CVD film made of tetraethoxysilane having a film thickness of 1,000 angstroms was formed using Producer S available from Applied Material. This film had an elemental composition of Si (32 atomic %), O (64 atomic %) and H (4 atomic %).

The adhesion of the stacked film was evaluated. As a result, peeling was observed in an interface between the CVD film as a lower layer and the film with respect to the three stud pins. Also, peeling was observed in an interface between the film and the CVD film as an upper layer with respect to the five stud pins.

According to the present invention, it is possible to provide a dielectric film (substrate for semiconductor) having superior adhesion to a CVD film by applying a method for the formation of a film comprising applying two or more alkoxysilane hydrolysis condensates, with a difference in a radius of gyration of 5 nm or more from each other, or two or more alkoxysilane hydrolysis condensates, with a difference in a dielectric constant of 0.3 nm or more from each other, on a substrate and curing the substrate to form a stacked film.

What is claimed is:

1. A stacked film comprising:
   (A) a film prepared by heat curing (a) an alkoxysilane hydrolysis condensate having a mean radius of gyration of from 10 to 30 nm in the form of solution, and
   (B) a film prepared by heat curing (b) an alkoxysilane hydrolysis condensate having a mean radius of gyration of less than 10 nm in the form of a solution,
   with a difference in the mean radius of gyration between the alkoxysilane hydrolysis condensate (a) and the alkoxysilane hydrolysis condensate (b) being 5 nm or more, wherein the alkoxysilane hydrolysis condensate is obtained by hydrolysis and condensation of at least one silane compound selected from the group consisting of:
   a compound represented by the following general formula (1):

$$R_a Si(OR^1)_{4-a} \tag{1}$$

wherein R represents a hydrogen atom, a fluorine atom, or a monovalent organic group: $R^1$ represents a monovalent organic group; and a represents an integer of 1 or 2, a compound represented by the following general formula (2):

$$Si(OR^2)_4 \qquad (2)$$

wherein $R^2$ represents a monovalent organic group, and a compound represented by the following general formula (3):

$$R^3{}_b(R^4O)_{3-b}Si—(R^7)_d—Si(OR^5)_{3-c}R^6{}_c \qquad (3)$$

wherein $R^3$ to $R^6$ may be the same or different and each represents a monovalent organic group: b and c may be the same or different and each represents a number of from 0 to 2; $R^7$ represents an oxygen atom, a phenylene group, or a group represented by —$(CH_2)_n$—, wherein n represents an integer of from 1 to 6; and d represents 0 or 1.

2. A stacked film comprising:

(A) a film having a dielectric constant of 2.5 or less, which is prepared by heat curing (a) an alkoxysilane hydrolysis condensate in the form of a solution, and (B) a film having a dielectric constant exceeding 2.5, which is prepared by heat curing (b) an alkoxysilane hydrolysis condensate in the form of a solution, with a difference in the dielectric constant between the film (A) and the film (B) being 0.3 or more, wherein the alkoxysilane hydrolysis condensate is obtained by hydrolysis and condensation of at least one silane compound selected from the group consisting of:

a compound represented by the following general formula (1):

$$R_aSi(OR^1)_{4-a} \qquad (1)$$

wherein R represents a hydrogen atom, a fluorine atom, or a monovalent organic group; $R^1$ represents a monovalent organic group; and a represents an integer of 1 or 2.

a compound represented by the following general formula (2):

$$Si(OR^2)_4 \qquad (2)$$

wherein $R^2$ represents a monovalent organic group, and a compound represented by the following general formula (3):

$$R^3{}_b(R^4O)_{3-b}Si—(R^7)_d—Si(OR^5)_{3-c}R^6{}_c \qquad (3)$$

wherein $R^3$ to $R^6$ may be the same or different and each represents a monovalent organic group; b and c may be the same or different and each represents a number of from 0 to 2: $R^7$ represents an oxygen atom, a phenylene group, or a group represented by —$(CH_2)_n$—, wherein n represents an integer of from 1 to 6: and d represents 0 or 1.

3. A method for the production of a stacked film, which comprises applying a coating solution comprising (B) a compound having a mean radius of gyration of less than 10 nm, the compound being obtained by hydrolysis and condensation of an alkoxysilane compound, and an organic solvent on a substrate, followed by drying; and then applying a coating solution comprising (A) a compound having a mean radius of gyration of from 10 to 30 nm, the compound being obtained by hydrolysis and condensation of an alkoxysilane compound, and an organic solvent on the substrate, followed by heating, wherein the alkoxysilane hydrolysis condensate is obtained by hydrolysis and condensation of at least one silane compound selected from the group consisting of:

a compound represented by the following general formula (1):

$$R_aSi(OR^1)_{4-a} \qquad (1)$$

wherein R represents a hydrogen atom, a fluorine atom, or a monovalent organic group: $R^1$ represents a monovalent organic group; and a represents an integer of 1 or 2, a compound represented by the following general formula (2):

$$Si(OR^2)_4 \qquad (2)$$

wherein $R^2$ represents a monovalent organic group, and a compound represented by the following general formula (3):

$$R^3{}_b(R^4O)_{3-b}Si—(R^7)_d—Si(OR^5)_{3-c}R^6{}_c \qquad (3)$$

wherein $R^3$ to $R^6$ may be the same or different and each represents a monovalent organic group; b and c may be the same or different and each represents a number of from 0 to 2; $R^7$ represents an oxygen atom, a phenylene group, or a group represented by —$(CH_2)_n$—, wherein n represents an integer of from 1 to 6; and d represents 0 or 1.

4. The method for the production of a stacked film as claimed in claim 3, wherein the substrate comprises Si and at least one element selected from the group consisting of O, C, N and H.

5. The method for the production of a stacked film as claimed in claim 3, which further comprises laminating a film comprising Si and at least one element selected from the group consisting of O, C, N and H, on the film formed.

6. An insulating film comprising the stacked film as claimed in claim 1 and at least one additional insulating film component.

7. A substrate for a semiconductor comprising the insulating film as claimed in claim 6.

8. A semiconductor comprising the stacked film as claimed in claim 1.

9. An insulating film comprising the stacked film as claimed in claim 2 and at least one additional insulating film component.

10. A substrate for semiconductor comprising the insulating film as claimed in claim 6.

11. A semiconductor comprising the stacked film as claimed in claim 2.

* * * * *